United States Patent
Bly

(10) Patent No.: US 6,194,721 B1
(45) Date of Patent: Feb. 27, 2001

(54) UNCOOLED FAR INFRARED THERMAL IMAGING SYSTEM

(75) Inventor: Vincent T. Bly, Springfield, VA (US)

(73) Assignee: The United States of America as represented by the Secretary of the Army, Washington, DC (US)

(*) Notice: Subject to any disclaimer, the term of this patent is extended or adjusted under 35 U.S.C. 154(b) by 0 days.

(21) Appl. No.: 06/901,081

(22) Filed: Jul. 31, 1986

(51) Int. Cl.⁷ ........................... H01T 19/04; H01L 31/00
(52) U.S. Cl. ........................ 250/332; 250/352; 257/443; 257/447
(58) Field of Search ........................... 250/330, 332, 250/333, 338 SE, 352, 472.1–474.1, 393, 338 PY; 350/353, 354, 359, 360, 361, 363; 257/443, 447

(56) References Cited

U.S. PATENT DOCUMENTS

| | | | |
|---|---|---|---|
| 3,603,794 | * | 9/1971 | Mast ..................................... 250/330 |
| 3,967,121 | * | 6/1976 | Redman ............................... 250/330 |
| 4,272,164 | * | 6/1981 | Trussell, Jr. ...................... 350/363 X |
| 4,441,791 | * | 4/1984 | Hornbeck ............................. 350/360 |
| 4,494,826 | * | 1/1985 | Smith ................................... 350/360 |
| 4,497,544 | * | 2/1985 | Mitchell et al. ................ 350/363 X |

* cited by examiner

Primary Examiner—Stephen C. Buczinski
(74) Attorney, Agent, or Firm—Aubrey J. Dunn; Max L. Harwell; Robert P. Gibson

(57) ABSTRACT

An infrared image is directed onto a transducer having a planar array of absorbing discs, on one side. The discs are supported by a thin membrane which sags or bulges as the discs heat up. The discs thus change their spacings with respect to a partially reflective mirror. The nominal spacing between the discs and mirror is about ¼ wave-length of the infrared radiation, such that absorption is enhanced. The mirror is supported on a transparent substrate through which visible or near-infrared radiation is shown; the mirror/discs thus establish a Fabry-Perot cavity for this radiation, whereby a visible or near-infrared image may be observed or detected as the various discs establish various spacings in accordance with incremental variations in the infrared image. An alternate embodiment uses an electrostatic field to pre-bias the discs toward the mirror and thus to tune or adjust the sensitivity of the transducer.

4 Claims, 4 Drawing Sheets

UNCOOLED FAR INFRARED THERMAL IMAGING SYSTEM

The invention described herein may be manufactured, used, and licensed by the U.S. Government for governmental purposes without the payment of any royalties thereon.

BACKGROUND OF THE INVENTION

This invention is in the field of systems for presenting visable images of far-infrared scenes, and is particularly concerned with an uncooled imaging transducer for converting a far-infrared image to a visible or near-infrared image. There are various systems known for providing visible or near-infrared images of far-infrared scenes; these systems include both thermal and quantum types of detectors, each with its own advantages. Unfortunately, all of these systems suffer from one or more significant disadvantage. Specifically, for a thermal detector, only a very small percentage of the incident radiation is actually used to advantage in producing a visible image; the majority of the radiation is essentially dumped into a heat sink because of poor thermal isolation between the detector elements and their support substrate. In the case of a quantum detector, cryogenic cooling is usually required for efficient operation in the far-infrared. Thermal detectors, beside having the problem of poor thermal isolation (which degrades sensitivity), also have large thermal masses (which lengthen time responses). The instant invention is uncooled, and because of its construction, has detector elements with greater thermal isolation (which gives greater sensitivity) than known thermal systems, and less thermal mass (which gives a faster time response) than such known thermal systems.

SUMMARY OF THE INVENTION

This invention is an uncooled system for converting a far-infrared image to a visible image or near-infrared image. The system includes a transducer onto one side of which a far-infrared image is directed, and which provides either a visible image or a near-infrared image on the opposite side. The transducer includes a planar array of far-infrared absorbing islands on a thin-film support. The film is supported by a perforated plate, with the perforations centered on the islands. There is, on the opposite side of the plate from the film, a perforated shield in registration with the islands, and a partially-reflective sheet. The spacing between the sheet and the islands is such that far-infrared absorption in the islands is enhanced. The sheet is supported by a relatively thick and (visible light or near-infrared) transparent substrate. The bottoms of the islands on the film and the partially-reflective sheet together form a Fabry-Perot cavity for visible or near-infrared radiation directed through the substrate, whereby an image may be viewed or detected. An alternate embodiment of the invention additionally includes thin conductors connected to the islands and to one pole of a voltage source, with the other pole of the source connected to either (or both) the shield or the partially-reflective sheet. This voltage induces a force to bias the islands toward the substrate.

DETAILED DESCRIPTION OF PREFERRED EMBODIMENTS

Figure 1:
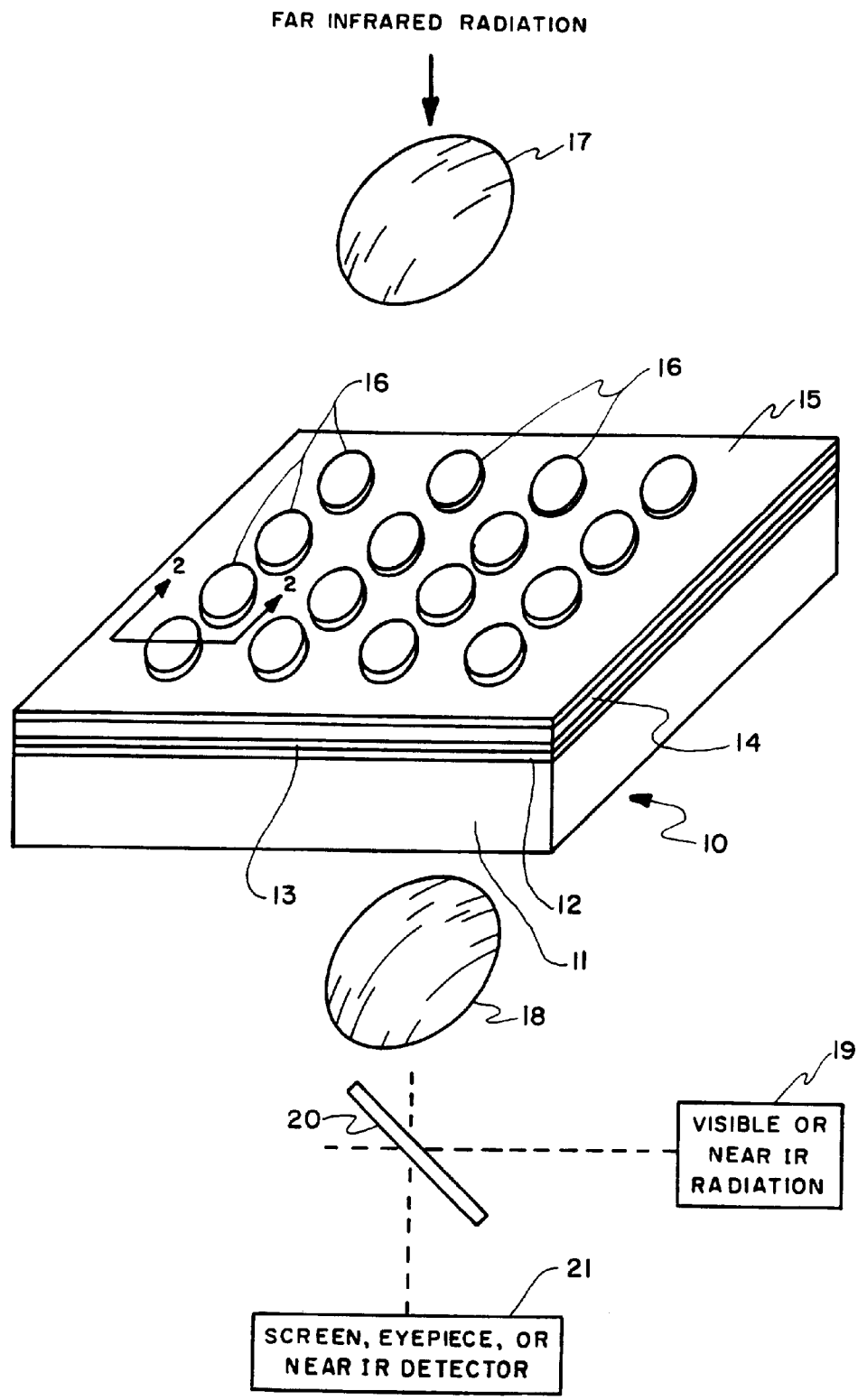
FIG. 1 is a schematic/pictorial showing one embodiment of the invention.

The invention may be best understood when this description is taken in conjunction with the drawings. Referring now to FIG. 1, we see transducer 10 consisting of transparent substrate 11, with a partially-reflective metal/dielectric mirror 12 thereatop, metallic mask 13 on mirror 12, perforated spacer 14 on mask 13, thin membrane 15, and metal islands, discs, or mesas 16 on membrane 15 in a regular array. Far-infrared radiation is directed by lens 17 as an array image onto islands 16 and membrane 15. A visible or near-infrared image is extracted from the transducer by visible or near-infrared radiation directed through substrate 11 by lens 18. This radiation is provided by radiator 19 directing a beam onto partially-reflective mirror (beam splitter) 20. The radiation reflected from the transducer also passes through 20 to a screen or an eyepiece (for visible light) or a near-infrared detector where box 21 is located.

Figure 5:
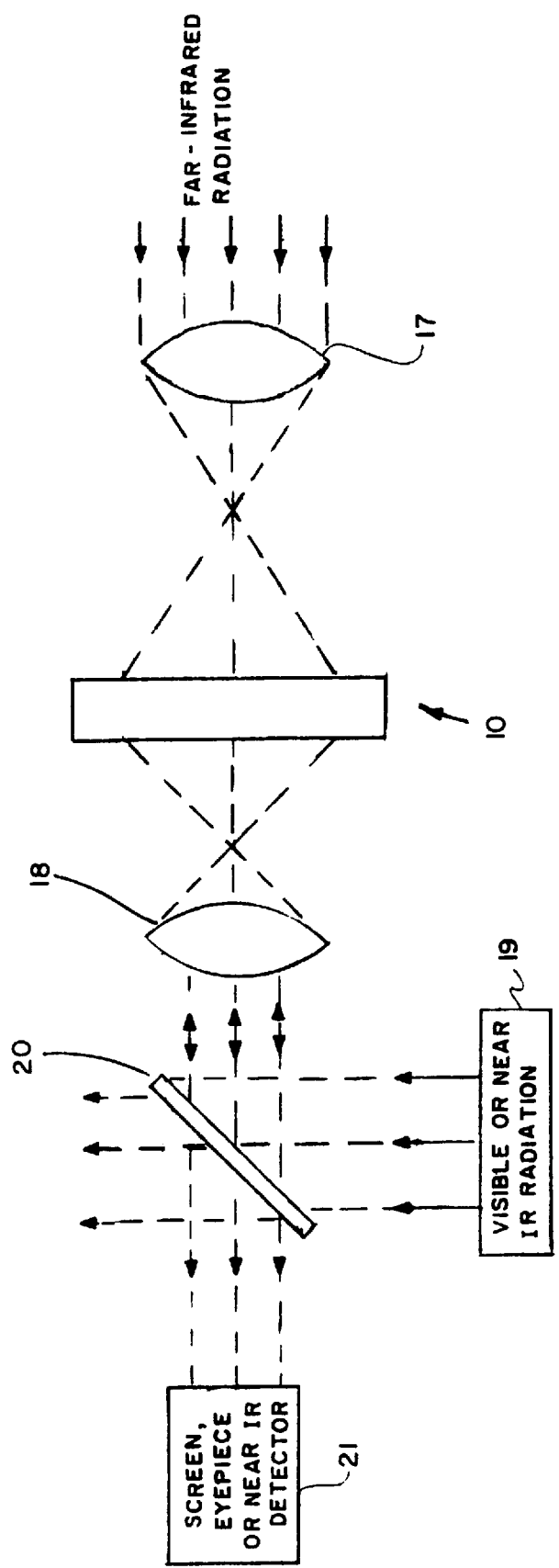
FIG. 5 is a schematic, plan, side, view of the invention, showing radiation rays.

FIG. 5 shows more clearly the radiation paths of FIG. 1. As can be seen in FIG. 5, incoming far-infrared radiation is directed by lens 17 onto transducer 10. Radiation from 19 is directed onto beam splitter 20, and a portion of this radiation is reflected through lens 18 onto the opposite side of transducer 10 from the far-infrared radiation. Radiation reflected from this opposite side of 10 passes through lens 18, and partially passes through beam splitter 20 to screen, etc. 21. This drawing (and the other drawings) is not to scale.

Figure 2:
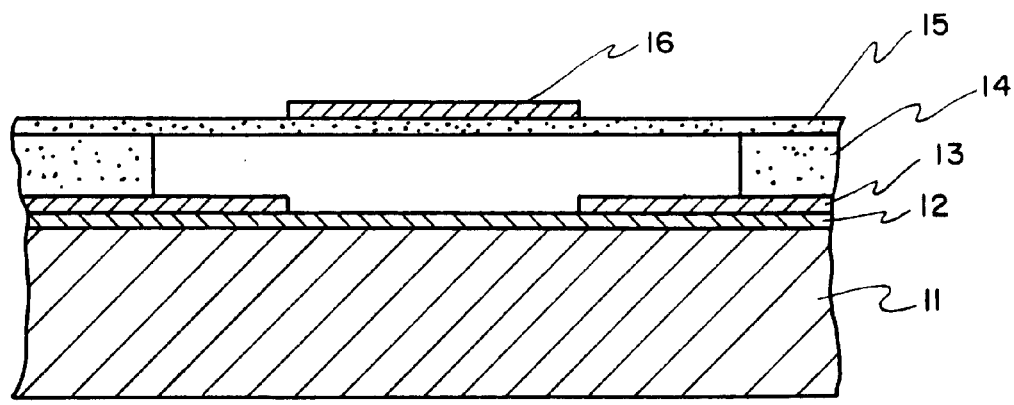
FIG. 2 is a partial sectional view (enlarged in some dimensions) taken in direction 2—2 in FIG. 1.

Looking now to FIG. 2, we can see some of the details of the invention not visible in FIG. 1. Substrate 11 is relatively thick compared to the other layers, and may be one-quarter inch thick glass. Mirror 12 is a thin metal/dielectric layer, at least partially reflective to both visible and infrared radiation. Mask (or blocking layer) 13 is perforated in a regular array corresponding to and in registration with the island array. The mask may be in the form of an opaque metal layer, or other forms. Spacer 14 is relatively thick compared to 12 and 13, is on the order of 2.5–7.5 $\mu$m thick and may be made of an insulator such as ZnS. Membrane 15 is an ultrathin film (50–500 Å) of aluminum oxide, cellulose nitrate, or another polymer. It is chosen to have a thermal coefficient of linear expansion greater than that of the metal islands, mesas, or discs. The discs, 16 are formed to match one-half free-space impedance (approximately 188 ohms per square). Typical (but not limiting) dimensions in the transducer are as follows: disk diameter is 25 $\mu$m on 50 $\mu$m centers, spacer perforation diameters are 40 $\mu$m, and mask perforation diameters are 25 $\mu$m. It should be understood that the thickness of film 15 is greatly exaggerated in the drawings. If drawn to scale, it would be invisible.

Figure 4:
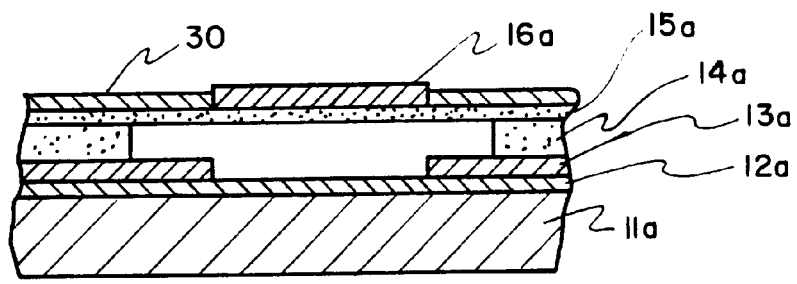
FIG. 4 is a partional sectional view (enlarged in some dimensions) taken in direction 4—4 in FIG. 3.
Figure 3:
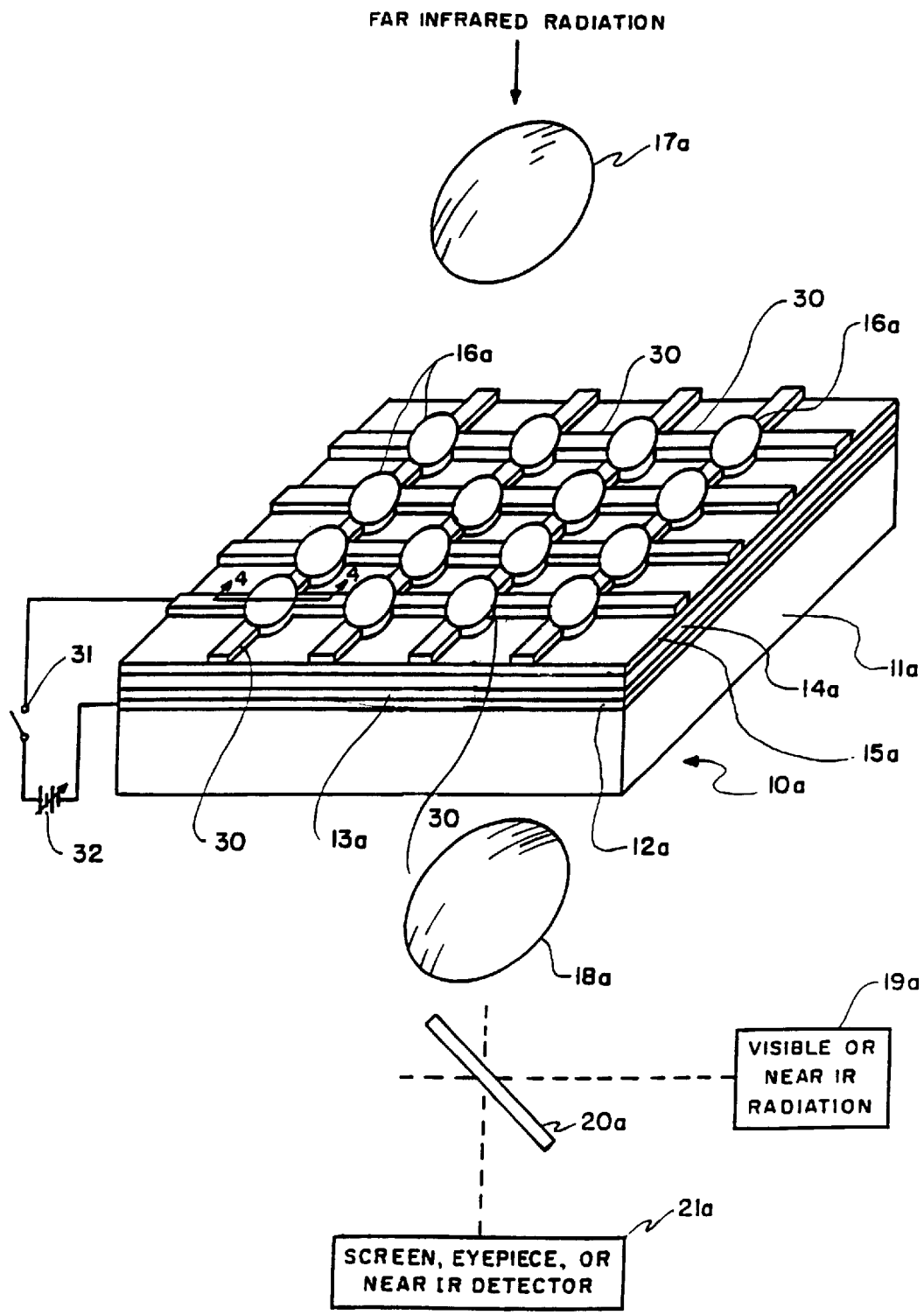
FIG. 3 is a schematic/pictorial showing of an alternate embodiment of the invention.

The alternate embodiment of the invention in FIGS. 3 and 4 is similar in most respects to the FIGS. 1 and 2 embodiment, but includes in addition an interconnecting electrical grid with conductors 30 joining discs 16a. Connected to this grid through switch 31 is one pole of a variable voltage source 32. The other pole of 32 is connected to mirror 12a (or mask 13a or both). Elements 10a–21a of FIGS. 3 and 4 directly correspond to respective elements 10–18 of FIGS. 1 and 2. Conductors 30 should be as thin and narrow as possible, to avoid problems such as having them act as support struts or heat conductors. The paths of the various radiation rays will be the same as shown for FIG. 1 in FIG. 5.

Operation of Invention (FIGS. 1 and 2)

Incoming far-infrared radiation is directed as an image onto discs 16 and membrane 15. Discs 16 absorb this radiation and heat up. The heat is tranferred to and causes the portions of the membrane around each disc to expand and to sag or bulge (it is not important which). This causes displacement of the discs with respect to the partially-reflective mirror (12). The nominal spacing between the discs and mirror is chosen to be about one-quarter wavelength of some medium incoming infrared wavelength (a medium incoming wavelength may be 10 $\mu$m). This spacing is determined by the thickness of 12, 13, and 14 and enhances absorption of the infrared radiation. The transducer is read out (i.e. an image may be seen) by visible or near-infrared radiation, preferably monochromatic (such as laser radiation) directed through the substrate, through the mirror, and onto the opposite side of the discs from the infrared radiation. The discs are highly reflective to this radiation and a Fabry-Perot cavity is thus formed between each disc and the corresponding portion of the mirror. Slight variations in the spacings therebetween thus cause significant variations in the light reflected from the transducer. I estimate that the spacing will change on the order of 10 Å per millidegree Celsius change in temperature of the far-infrared image on the transducer. The different incremental temperatures of the far-infrared image thus induce corresponding spacings in the Fabry-Perot cavities and allow a visible or near-infrared image to be readily obtained.

The operation of the alternate embodiment of FIGS. 3 and 4 is similar to that of the FIGS. 1 and 2 embodiment, except that the electrostatic field induced when switch 31 is closed allows discs 16*a* to be physically biased toward 12*a* and thus to tune the transducer, or to adjust its sensitivity.

While specific embodiments of the invention have been shown and described, obvious variations to these embodiments should be obvious to one skilled in the art, but still within the scope of the invention. For example, 12 and 13, and 12*a* and 13*a* may be combined in each case. Also, the grid of FIGS. 3 and 4 may be replaced by a thin conductive layer overlying 15, or by such a layer (transparent to far-infrared radiation) overlying both 15 and discs 16. Moreover, it may be possible to make membranes 15 or 15*a* slightly electrically conductive.

I claim:

1. A far-infrared imaging system including:

a substrate essentially transparent to visible or infrared radiation;

a mirror on said substrate partially reflective to visible or infrared radiation;

a perforated spacer plate on said mask and in registration therewith;

an ultrathin-film flexible insulating membrane on said spacer plate;

an array of far-infrared-absorbing and visible or near-infrared radiation reflecting islands on said membrane, each island being in registration with a respective perforation of said spacer plate, wherein said membrane is nominally spaced approximately one-quarter the wavelength of the far-infrared from said substrate, whereby a quarter-wave absorber for far-infrared is established between said islands and said mirror, and whereby said membrane expands as said far-infrared radiation is absorbed and said islands thus move with respect to said mirror;

means for directing a far-infrared image onto said array;

and means for directing visible or near-infrared radiation through said substrate, mirror, mask and spacer plate onto the opposite side of the islands of said array from the far-infrared image, whereby the space between said islands and said mirror acts as a Fabry-Perot cavity for said visible or near-infrared radiation, and whereby variations in the reflectance of said Fabry-Perot cavity to visible or near-infrared radiation occur as said membrane expands and said islands move with respect to said mirror, wherein said variation in reflectance over the array of islands define a visible or near-infrared image.

2. The system as set forth in claim 1 further including means for biasing said islands toward said mirror.

3. The system as set forth in claim 2 wherein said means for biasing includes means for applying an electrostatic field between said islands and said spacer plate.

4. The system as set forth in claim 3 wherein said means for applying includes: a voltage source with two different polarity poles, and with one pole connected to said mirror or said mask, or both; and electrical conducting means connected to said islands and to the other pole of said voltage source.

* * * * *